United States Patent [19]

Kamimura

[11] 4,206,349
[45] Jun. 3, 1980

[54] ELECTRON MICROSCOPE

[75] Inventor: Shoji Kamimura, Katsuta, Japan

[73] Assignee: Hitachi, Limited, Japan

[21] Appl. No.: 964,877

[22] Filed: Nov. 30, 1978

[30] Foreign Application Priority Data

Dec. 1, 1977 [JP] Japan .................................. 52-143324

[51] Int. Cl.$^2$ ............................................ G01M 23/00
[52] U.S. Cl. ...................................... 250/311; 250/398
[58] Field of Search ................................. 250/311, 398

[56] References Cited

U.S. PATENT DOCUMENTS 3,514,595  5/1970  Schwarz et al.
3,835,246  9/1974  Muller et al. .......................... 250/311

FOREIGN PATENT DOCUMENTS 976669  10/1975  Canada ...................................... 250/311

*Primary Examiner*—Harold A. Dixon
*Attorney, Agent, or Firm*—Craig and Antonelli

[57] ABSTRACT

An electron microscope comprising an electron gun for generating an electron beam, an electron lens system for irradiating a specimen with the electron beam, an electron lens system for magnifying an electronic image transmitted through the specimen, a fluorescent plate arranged removably in the path of the magnified electron image for converting the magnified transmitted electron image into a visual image, a viewing window for observing the visual image, a CRT display unit for displaying data related to the transmitted electron image, which is arranged at a position where the data is visible from the viewing window, and an optical system for projecting the data on a photo-sensitive material which is exposed to the transmitted electron image.

10 Claims, 3 Drawing Figures

ELECTRON MICROSCOPE

BACKGROUND OF THE INVENTION

This invention relates to an electron microscope, and more in particular to a transmission type electron microscope in which a cathode ray tube is provided for displaying data characteristic of the enlarged transmission electron image so that the data displayed on the cathode ray tube is observable through the viewing window of the image observation chamber, and means is provided for projecting the data displayed on the cathode ray tube on a photographing medium.

Data display associated with the transmission type electron microscope (hereinafter referred to as the "electron microscope") includes the value of magnification, camera length, acceleration voltage, film number and lens condition (operating mode).

In the conventional electron microscopes, these data are displayed on display units located dispersively on the control panel. It has so far been difficult to display these data at a single position due to the size limit of the numerical display unit or display lamp. Further, in the event that the numerical display unit or display lamp burns out, they are required to be replaced.

SUMMARY OF THE INVENTION

An object of the present invention is to provide, in order to obviate the above-mentioned disadvantages, a transmission type electron microscope in which data characteristic of the enlarged transmission electron image is displayed on a cathode ray tube so that the data displayed on the cathode ray tube is observable through the viewing window of the image observation chamber and, on photographing the enlarged transmission electron image, is projected on a photographing medium.

According to the present invention, there is provided a transmission type electron microscope comprising a cathode ray tube arranged at a position observable through the viewing window of the image observation chamber, and means for projecting the data displayed on the cathode ray tube screen on a photographing element, thus making possible observation of data displayed on the cathode ray tube screen without looking aside and projection of data displayed on the cathode ray tube screen onto the photo-sensitive material at the time of photographing of a specimen.

DETAILED DESCRIPTION OF THE INVENTION

Figure 1:
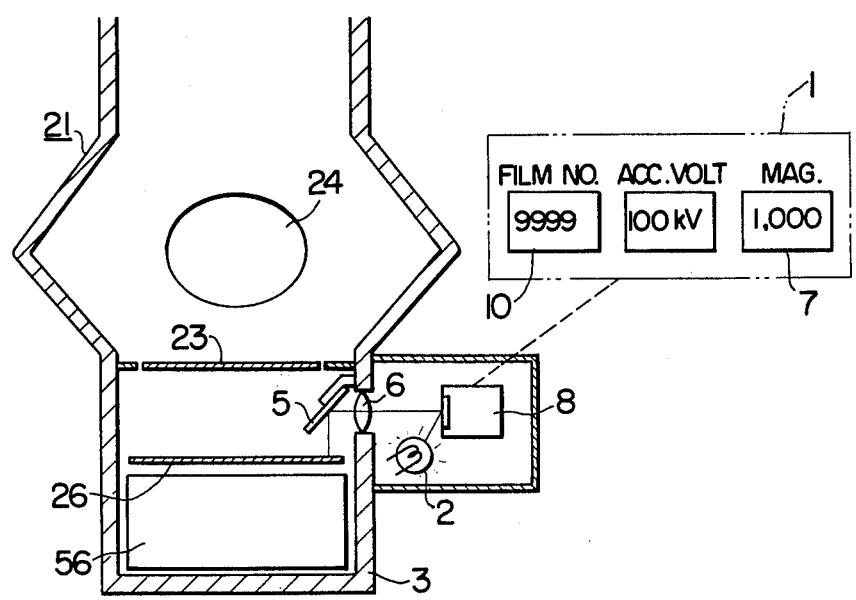
FIG. 1 is a schematic diagram showing an example of the construction of a conventional image observation chamber and data display unit of the transmission type electron microscope.

For facilitating the understanding of the present invention, explanation will first be made of the construction of the image observation chamber 21 and the data display unit of a conventional transmission type electron microscope with reference to FIG. 1. Reference numeral 1 designates a control panel on which such data as photographing number of film number, acceleration voltage and magnification are displayed. The data are displayed by, for instance, a counter constituting the film number indicator 10, and a numerical display tube as the magnification indicator 7. These data indicators are dispersively arranged on the panel, and therefore are high in cost. Further, in view of the fact that the data cannot be observed unless looking aside from the viewing window 24 through which the enlarged transmission electron image is observable on the fluorescent plate 23, the low workability results on the one hand, and the use of lamp 2 poses the problem of short service life on the other hand. In respect of the exposure of photographing element or photo-sensitive plate 26 to light, an exposure data indicator 8 equivalent to the data indicators mounted on the control panel 1 is disposed in the vicinity of the camera chamber 3, so that the data image is transmitted to the photo-sensitive plate 26 by the lens 6 or mirror 5 for the purpose of simultaneous exposure with the electron microscopic image. As a non-radiative counter is used as a film number indicator of the exposure data indicator 8, the numeral on the counter is adapted to be illuminated by the lamp 2 so that the numeral may be projected onto the photo-sensitive plate 26. The photosensitive plate thus exposed is housed in a photo-sensitive plate casing 56. This system, as described above, requires a device equivalent to the data indicators mounted on the control panel 1, resulting in the disadvantages of increased wiring steps and high cost. Especially if the data to which the photo-sensitive plate 26 is exposed is to be increased in variety or number, more display tubes are required, thus necessitating a wider mounting area. As a result, the spatial limitation in the vicinity of the camera chamber 3 makes it impossible to use all the data for exposure except the magnification and film number at most.

This disadvantage is obviated in this invention by employing a cathode ray tube as the data display unit.

Figure 2:
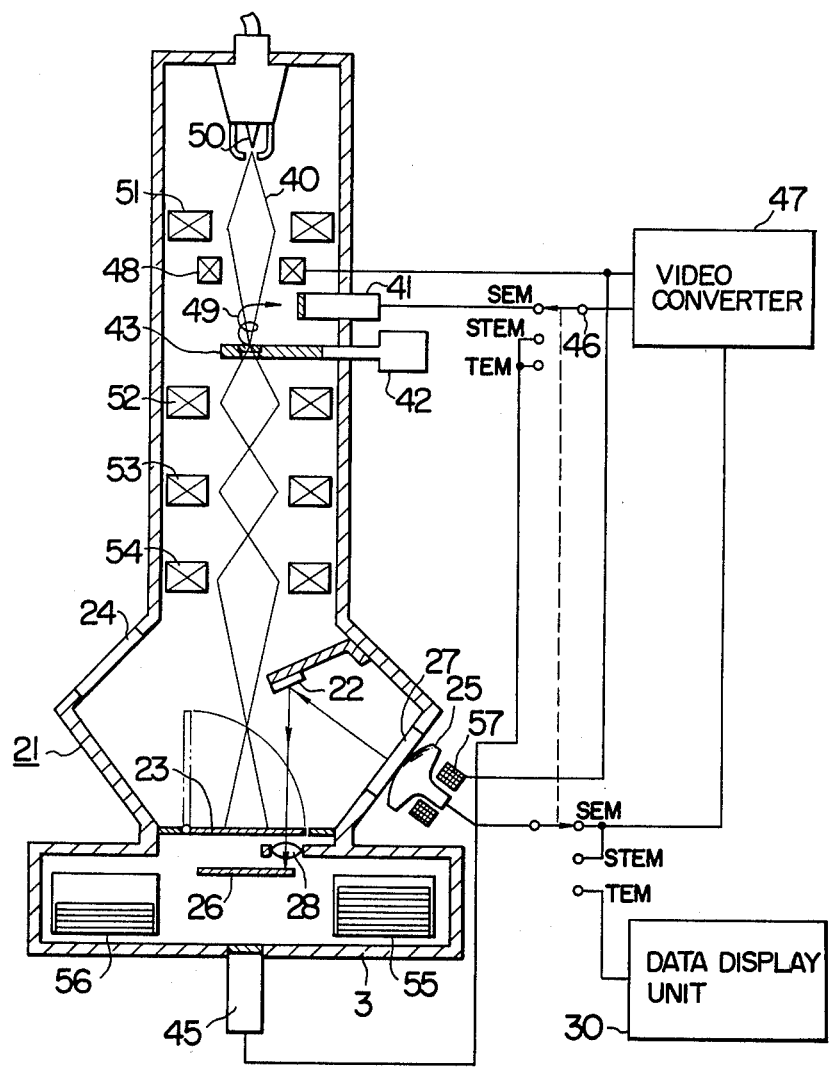
FIG. 2 is a schematic diagram showing an embodiment of the transmission type electron microscope having the image observation chamber and the data display unit according to the present invention.

The present invention will be described below with reference to an embodiment shown in FIG. 2. Numeral 21 designates an observation chamber containing an enlarged transmission electron image which is visible through the viewing window 24. Numeral 23 designates a fluorescent plate which functions as a shutter at the time of observation of an image. The surface of the fluorescent plate 23 is coated with a fluorescent material, so that an enlarged transmission electron image is observable as visual image on the fluorescent plate 23. The diagram of FIG. 2 shows the condition in which the enlarged transmission electron image is observed with the fluorescent plate 23 closed. At the time of exposure of the photo-sensitive plate 26 to the enlarged transmission electron image, the fluorescent plate 23 is located at the position as shown by dotted line. Under the condition as shown in FIG. 2, enlarged transmission electron image can be observed through the viewing window 24 by illuminating the fluorescent material on the fluorescent plate 23 with the electron beam. Numeral 25 designates a cathode ray tube having deflection coils 57. The data of all types displayed on the control panel 1 in FIG. 1 are displayed on this cathode ray tube 25. The displayed data can be observed through the cathode ray tube window 27 and the viewing window 24. According to the embodiment shown in FIG. 2, a plurality of data which otherwise might be dispersed on the control panel 1 in the conventional microscopes are concentrated at one place, with the result that the data are observable while at the same time observing the enlarged transmission electron image, thereby improving the workability. The data on the cathode ray tube 25, on the other hand, is reflected on the mirror 22, and through the lens 28, can be projected on photo-sensitive plate 26 for photographing. The camera chamber 3 is so constructed that the photo-sensitive plate 26 exposed to the enlarged transmission electron image and data is stored in the photo-sensitive plate storage box 56, and after that, another photo-sensitive plate is placed in the exposure position from the photo-sensitive plate supply box 55. This construction eliminates the need of the exposure data indicator used for exposure of the photo-sensitive plate 26 in the conventional electron microscope, thus contributing to great cost reduction.

Furthermore, according to the embodiment shown in FIG. 2, in addition to the various data mentioned above, the scanning electron image (SEM image) and the scanning transmission electron image (STEM image) can be displayed on the cathode ray tube, if desired. An image change-over display mechanism for this purpose is schematically shown in FIG. 2. In this drawing, numeral 41 designates a detector for detecting secondary electrons 49 for observing the SEM image, and numeral 42 a specimen holder for inserting the specimen 43 into the path of the electron beam. The electron beam 40 emitted from the filament 50 of the electron gun is focused through the condenser lens 51 on the specimen 43. The electron beam 40 transmitted through the specimen 43 is magnified by an electron lens system including an object lens 52, an intermediate lens 53 and a projection lens 54, whereby the enlarged transmission electron image (TEM image) is observed as visual image on the fluorescent plate 23. Numeral 45 designates a scanning transmitted electron detector is used when STEM image is observed. In other words, the SEM and STEM images are converted into image signals by the video converter 47 and projected on the display cathode ray tube 25 arranged at a position easily visible from the viewing window 24. Numeral 46 designates a mode change-over switch for SEM, STEM and TEM images. Numeral 30 designates a data display unit for displaying such data as the magnification and acceleration voltage for the TEM image on the cathode ray tube 25. In the shown condition, the SEM mode is selected by the change-over switch 46, and an image of the secondary electrons 49 detected by the secondary electron detector 41 is displayed on the cathode ray tube 25. When the mode change-over switch 46 is set at TEM mode, data associated with the TEM image is applied to the cathode ray tube 25 from the data display unit 30, so that the particular data and the TEM image are observable at the same time. If the change-over switch 46 is set at STEM mode, on the other hand, the fluorescent plate 23 is opened and the STEM image is displayed on the cathode ray tube 25 in response to a signal from the scanning transmitted electron detector 45. In this way, not only the SEM and STEM images are observable from the viewing window 24 but also such a scanned image as the SEM image on the cathode ray tube 25 can be observed from the viewing window 24 for comparison with the TEM image. Further, the data required for the TEM image is easily observed without looking aside, thus improving the workability greatly. Referring again to FIG. 2, in addition to the above-mentioned data, a reflected electron image, an X-ray image, a television electron microscope image or the like may be displayed on the cathode ray tube 25. It will also be easily understood that required data can be displayed on the cathode ray tube 25 even in SEM or STEM mode.

Figure 3:
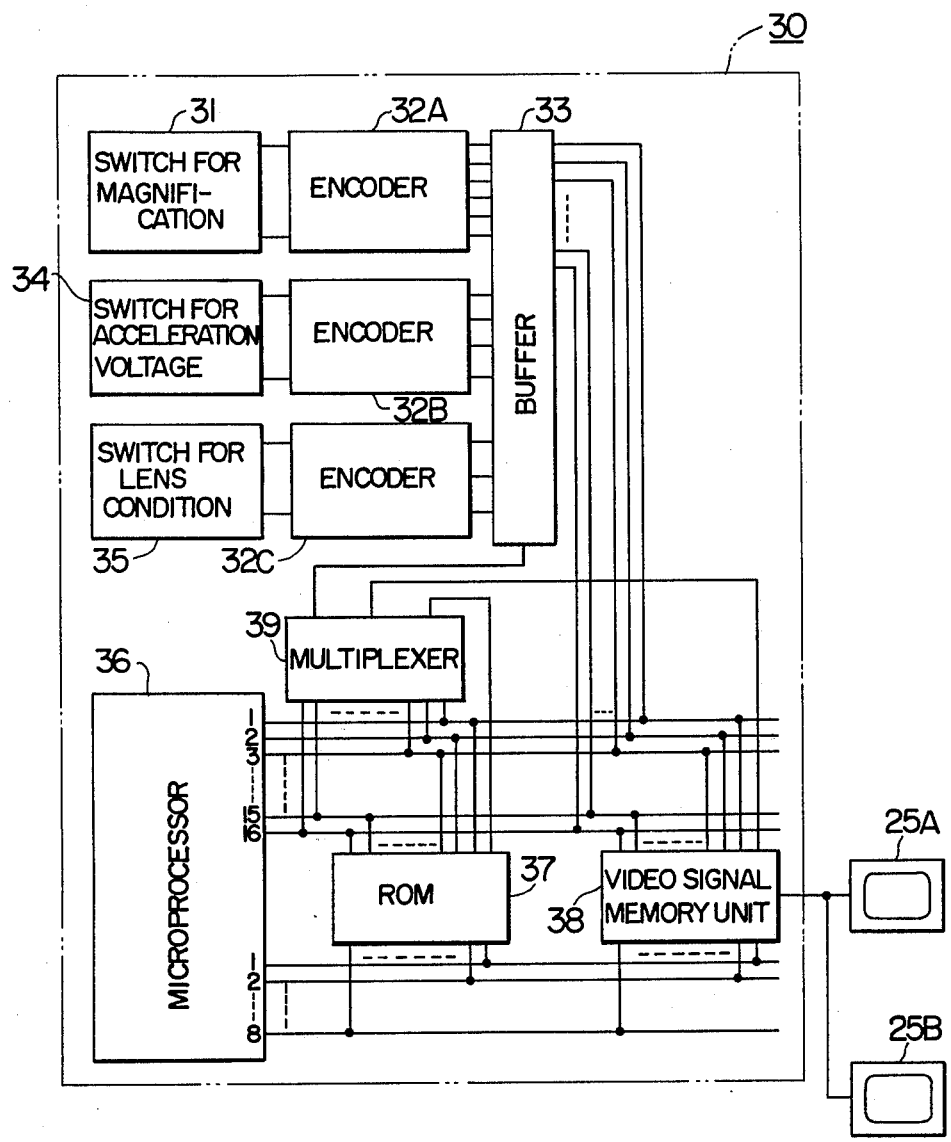
FIG. 3 is a block diagram showing a data display circuit used with the electron microscope according to the present invention.

For displaying data on the cathode ray tube 25, the well-known character generater is conveniently used. Also, if the latest microcomputer and television numerical display RAM are used, characters and numerals are displayed very easily, so that the name of the operator and data of operation in addition to the magnification, film number and acceleration voltage mentioned above are easily displayed on the cathode ray tube 25, thus making it possible to expose the photo-sensitive plate 26 to such data. In this case, another display cathode ray tube may be used so that two cathode ray tubes are operated to supply signals in parallel for exclusive purpose of exposure, thus improving the practical value of the system further. An example of the circuit for such a data display system is shown in FIG. 3. In this drawing, numerals 31, 34 and 35 designate devices mounted on the control panel of the electron microscope for switching the magnification, acceleration voltage and lens condition respectively. The lens conditions for this type of microscope include electron refraction mode and ordinary observation under microscope. The ordinary observation, in turn, is divided into low-magnification mode and zoom mode, which are switched as desired. Numerals 32A to 32C designate encoders for converting the set position (notch position) of each change-over switch into a binary number. The resulting binary number is applied through a buffer 33 to an address line of the microprocessor 36. Numeral 37 designates a ROM (read only memory) in which display data for various magnifications, acceleration voltages and lens conditions (operating modes ) to be selected are written in advance. Assuming that a particular magnification is selected by the magnification change-over switch 31, the encoder 32A and buffer 33 designate a corresponding ROM address, so that the data written in that address is read out and transferred to the video signal memory unit 38. The video signal memory unit 38 incorporates a circuit having the function of RAM (random access memory) and means for producing a video signal of numeral and character. Thus, in accordance with the data transmitted to the video signal memory unit 38, a magnification is displayed on the screens of the cathode ray tubes 25A and 25B. Numeral 39 designates a multiplexer which generates a strobe for driving buffer 33, ROM 37 or the video signal memory unit 38. As obvious, the positions of the character displayed on the screens of the cathode ray tubes 25A and 25B can be easily moved by changing the address of RAM incorporated in the video signal memory unit 38. This fact is effectively utilized in printing a character on the film or in the case where printing space is limited. At the time of observation, data is displayed in enlarged form at the central part of the scrren of the cathode ray tubes so as to be easily visible, while at the time of photography, only the required data can be moved to a corner in order to record it in predetermined space on the film.

I claim:

1. An electron microscope comprising means for generating an electron beam, means for focusing said electron beam on a specimen to thereby transmit said electron beam through said specimen, means for magnifying said transmitted electron beam to thereby obtain an enlarged transmission electron image, means arranged removably in a path of said magnified transmitted beam for converting said transmission electron image into a visual image, a viewing window for observing said visual image, a cathode ray tube for displaying data associated with said visual image, said cathode ray tube being arranged in a position to be visible from said viewing window, and means for projecting said data displayed on said cathode ray tube onto a photographing element exposed to said enlarged transmission electron image.

2. An electron microscope according to claim 1, further comprising means for scanning said specimen with said electron beam to thereby extract an information signal characteristic of said specimen, and means for displaying a scanned image corresponding to a scanned area of said specimen on said cathode ray tube on the basis of said information signal.

3. An electron microscope according to claim 1, further comprising means for changing position of data displayed on said cathode ray tube.

4. An electron microscope according to claim 2, further comprising means for changing position of a scanned image of the scanned area of said specimen.

5. An electron microscope according to claim 3, in which said data associated with said specimen is a magnification value.

6. An electron microscope according to claim 3, in which said data associated with said specimen is a magnification value and a photographing number.

7. An electron microscope according to claim 3, in which said data associated with said specimen are a magnification value, a film number, a symbol representing a lens condition, an acceleration voltage and a camera length.

8. An electron microscope according to claim 2, in which said information signal is a transmitted electron signal.

9. An electron microscope according to claim 2, in which said information signal is a secondary electron signal.

10. An electron microscope according to claim 1, further comprising deflection coils for scanning said specimen with said electron beam to thereby extract a transmitted electron signal and a secondary electron signal which are characteristic of said specimen, a secondary electron detector for detecting said secondary electron signal, a transmitted electron signal detector for detecting said transmitted electron signal, a first mode change-over switch for switching an output of said secondary electron signal detector and an output of said scanning transmitted electron signal detector, a video converter for converting said switched electron signal into a video signal for display on said cathode ray tube, and a second mode change-over switch for switching an output of said video converter and an output of a circuit for displaying said data, in a manner interlocked with said first mode change-over switch.

* * * * *